(12) United States Patent
Pollock

(10) Patent No.: US 7,382,170 B2
(45) Date of Patent: Jun. 3, 2008

(54) PROGRAMMABLE DELAY CIRCUIT HAVING REDUCED INSERTION DELAY

(75) Inventor: Steven J. Pollock, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 84 days.

(21) Appl. No.: 11/405,822

(22) Filed: Apr. 18, 2006

(65) Prior Publication Data

US 2007/0241800 A1    Oct. 18, 2007

(51) Int. Cl.
*H03H 11/26* (2006.01)
(52) U.S. Cl. .................. 327/261; 327/276; 327/278
(58) Field of Classification Search ............. 327/261, 327/276, 278
See application file for complete search history.

(56) References Cited

U.S. PATENT DOCUMENTS

| | | | |
|---|---|---|---|
| 5,945,861 A * | 8/1999 | Lee et al. ............... | 327/277 |
| 6,285,229 B1 | 9/2001 | Chu et al. | |
| 6,366,149 B1 * | 4/2002 | Lee et al. ............... | 327/276 |
| 6,737,901 B2 | 5/2004 | Hein et al. | |
| 6,838,917 B2 * | 1/2005 | Brass et al. ............. | 327/158 |

* cited by examiner

*Primary Examiner*—N. Drew Richards
*Assistant Examiner*—An T Luu
(74) *Attorney, Agent, or Firm*—Ryan, Mason & Lewis, LLP

(57) ABSTRACT

A programmable delay circuit includes a plurality of delay blocks, a plurality of corresponding tri-state drivers and at least one decoder. The delay blocks are connected together so as to form a series chain. Each of the tri-state drivers includes an input connected to an output of a corresponding one of the delay blocks, and a control input adapted to receive one of multiple control signals. The tri-state driver is operative in one of at least a first mode and a second mode as a function of a corresponding one of the control signals. In the first mode, an output signal generated at an output of the tri-state driver is a function of a voltage level at the input of the tri-state driver, and in the second mode the output of the tri-state driver is in a high-impedance state. The output of each of the tri-state drivers is coupled together and forms an output of the programmable delay circuit. The decoder is connected to the plurality of tri-state drivers. The decoder includes at least one control input for receiving at least a second signal and is operative to generate the control signals for activating a corresponding one of the tri-state drivers as a function of the second signal.

18 Claims, 2 Drawing Sheets

PROGRAMMABLE DELAY CIRCUIT HAVING REDUCED INSERTION DELAY

FIELD OF THE INVENTION

The present invention relates generally to clock distribution circuitry, and more particularly relates to techniques for balancing clock insertion delay in a clock distribution network.

BACKGROUND OF THE INVENTION

In many high-performance very large scale integration (VLSI) chips, including, for example, microprocessor chips, a reference clock signal, which may be generated externally and supplied to the chip, is distributed globally throughout the chip using a wiring network. The wiring network, which may be a tree-based network, a grid-based network, or a combination of a tree-based and a grid-based network, is typically re-powered at a number of points in the network by buffers. Each buffer ideally generates a signal that is identical to the original reference clock signal. It is essential that the signals generated by the various buffers arrive at their respective destinations throughout the chip substantially simultaneously so as to minimize clock skew, or arrive with precisely known timing differences so as to facilitate appropriate compensation of clock delays.

Balancing clock insertion delay across an entire chip to each destination clock load has been, and continues to be, a challenging and time-consuming problem involving many design netlist iterations and the commitment of significant computing and engineering resources. With the move to ever smaller geometries, the resulting increase in chip gate counts, and the integration of more and more intellectual property (IP) blocks and functions on a given chip, this problem has only grown in scope and complexity.

Most previous solutions for balancing clock insertion delay involve an elaborate process of placing and routing a current design netlist, extracting parasitics (e.g., capacitance, resistance, inductance, etc.) from a layout database for the netlist using an extraction tool, reading the design netlist into a static timing analysis tool, annotating the extracted parasitics in the static timing analysis, evaluating the timing information from the clock source to each destination clock load using the static timing analysis tool, adjusting the clock distribution network by modifying one or more circuit characteristics including wire routing in the chip, wire thickness, driver types, driver positions and/or the number of drivers, streaming out a new netlist, and iterating on the process until a desired clock insertion delay target is eventually obtained. However, this known approach is undesirable in that it is considerably time intensive, requiring many iterations and significant engineering resources, particularly for large designs where a single iteration can take several days or weeks to complete. Moreover, the resulting clock tree distribution is typically static and cannot be changed once the design is realized in silicon. Consequently, there is a risk that oversights in the initial design, as well as variations in process, voltage and/or temperature (PVT) characteristics of the chip, can cause the clock insertion delay to vary substantially from the desired target value, thereby requiring the purchase of additional mask sets and the performance of another chip fabrication cycle to correct the variation.

Accordingly, there exists a need for techniques for balancing clock insertion delay in a clock distribution network that do not suffer from one or more of the problems exhibited by conventional clock distribution architectures and methodologies.

SUMMARY OF THE INVENTION

The present invention meets the above-noted need by providing, in illustrative embodiments thereof, techniques for balancing insertion delay associated with distributing a repetitive high-frequency timing signal (e.g., a global clock signal) in an IC device. The invention preferably includes one or more programmable delay lines configurable for enabling the insertion delay to be quickly tuned without changing the design netlist and without modifying any of the design sub-blocks. Furthermore, the techniques of the present invention advantageously allow modification of the clock insertion delay after the design has been realized in silicon.

In accordance with one aspect of the invention, a programmable delay circuit includes a plurality of delay blocks, a plurality of corresponding tri-state drivers and at least one decoder. The delay blocks are connected together so as to form a series chain, an input of a first one of the plurality of delay blocks being adapted to receive a first signal supplied to the programmable delay circuit. Each of the tri-state drivers includes an input connected to an output of a corresponding one of the delay blocks, and a control input adapted to receive one of multiple control signals. The tri-state driver is operative in one of at least a first mode and a second mode as a function of a corresponding one of the control signals. In the first mode, an output signal generated at an output of the tri-state driver is a function of a voltage level at the input of the tri-state driver, and in the second mode the output of the tri-state driver is in a high-impedance state. The output of each of the tri-state drivers is coupled together and forms an output of the programmable delay circuit. The decoder is connected to the plurality of tri-state drivers. The decoder includes at least one control input for receiving at least a second signal and is operative to generate the control signals for activating a corresponding one of the tri-state drivers as a function of the second signal.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative programmable delay circuits operable for use, for example, in balancing clock insertion delays in a clock distribution network. It should be understood, however, that the present invention is not limited to clock distribution networks. Rather, the invention is more generally applicable to techniques for balancing insertion delays of distributed signals, such as a repetitive timing signal, in a circuit in such a manner as to advantageously allow modification of the insertion delays after the design has been realized in silicon. The techniques of the invention can be used for reducing iteration time for balancing insertion delays in an integrated circuit (IC) by allowing iterations to be performed directly in a static timing tool, without having to modify a netlist corresponding to the IC. Furthermore, aspects of the present invention can be used to balance insertion delays of non-repetitive pulses that are distributed throughout the IC, as will become apparent to those skilled in the art using the techniques described herein.

Figure 1:
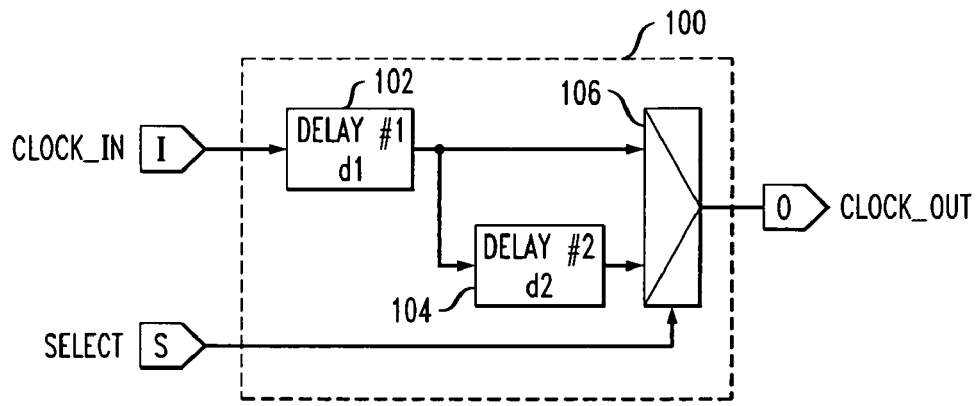
FIG. 1 is a block diagram depicting at least a portion of an illustrative programmable delay circuit in which techniques of the present invention can be implemented.

FIG. 1 is a block diagram illustrating at least a portion of an exemplary programmable delay circuit 100. The programmable delay circuit 100 is shown as including a first delay block 102 (Delay #1) and a second delay block 104 (Delay #2), although the invention is not limited to any particular number of delay blocks. The first delay block 102 has a first delay value, d1, associated therewith and the second delay block 104 has a second delay value, d2, associated therewith. The delay values d1 and d2 of the two delay blocks 102 and 104, respectively, are preferably substantially equal to one another, although the two delay values d1, d2 may alternatively be different. An output of each of the first and second delay blocks 102, 104 is preferably connected to respective inputs of a multiplexer 106, or alternative selection circuitry. An input signal, Clock_In, supplied to an input (I) of the programmable delay circuit 100 is fed to an input of the first delay block 102, and the output of the first delay block is preferably fed to an input of the second delay block 104. Thus, an output signal generated at the output of the first delay block 102 will preferably be substantially equal to the input signal Clock_In, delayed in time by d1, and an output signal generated at the output of the second delay block 104 will preferably be substantially equal to the input signal Clock_In, delayed in time by d1+d2. Logic gates included in the programmable delay circuit 100 are preferably selected so as to preserve a duty cycle of the input signal Clock_In.

The multiplexer 106 is preferably operative to generate an output signal, Clock_Out, at an output (O) of the programmable delay circuit 100 based on the value of a control signal, Select, applied to one or more control inputs (S) of the circuit. In this simple implementation, the programmable delay circuit 100 allows a user to select one of two possible delay paths, which may also be referred to herein as taps, from the input to the output of the programmable delay circuit based on the value of the Select control signal applied to the circuit. Assuming that the delay blocks 102, 104 are substantially identical to one another, the programmable delay circuit 100 will provide substantially equal delay steps between selected taps. Since there are only two delay paths to select in the illustrative programmable delay circuit 100, only a single control input is required. The programmable delay circuit 100 may be configured such that the one or more control inputs are defined to select a particular one of the delay paths directly or through some decoding logic included in the programmable delay circuit, force the output signal Clock_Out to a logic high state or a logic low state, or even tri-state the output of the programmable delay circuit.

Increasing the number of control inputs and the number of selectable delay paths will provide expanded programmability of the programmable delay circuit. As the number of selectable delay paths increases, however, a tri-state implementation of the programmable delay circuit is preferred over the multiplexed implementation shown in FIG. 1 so as to minimize insertion delay in the circuit.

Figure 2:
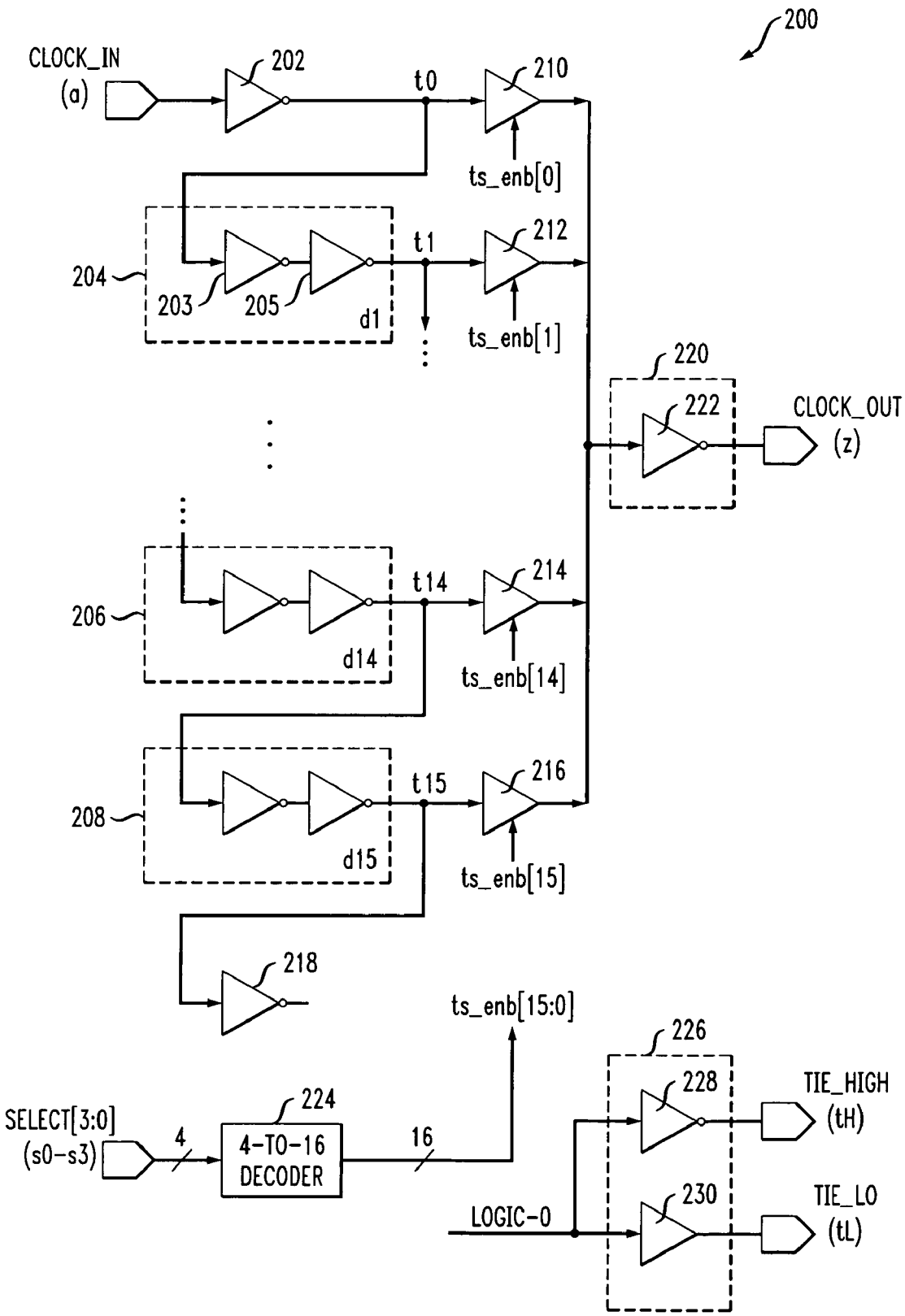
FIG. 2 is a schematic diagram depicting at least a portion of an illustrative programmable delay circuit, in accordance with an aspect of the present invention.

FIG. 2 is a schematic diagram depicting at least a portion of an exemplary programmable delay circuit 200, formed in accordance with an embodiment of the invention. As apparent from the figure, rather than using a multiplexer implementation, as shown in FIG. 1, the programmable delay circuit 200 preferably employs a tri-state arrangement which is beneficial for reducing insertion delay in the circuit, as will be described in further detail herein below. The programmable delay circuit 200 provides sixteen possible delay paths individually selectable as a function of four control signals, Select[3:0], supplied to respective control inputs, s0 through s3, of the programmable delay circuit. The control inputs are depicted as a 4-bit wide bus. It is to be understood that although sixteen selectable delay paths are shown, the invention is not limited to any particular number of delay paths in the programmable delay circuit.

The illustrative programmable delay circuit 200 comprises a plurality of delay blocks connected together as a series chain. Specifically, for all delay blocks except a last delay block in the chain, an output of each delay block is preferably connected to an input of a next successive delay block. The output of the last delay block in the chain, which has no successive delay block associated therewith, may be connected to a dummy load configured to have an input impedance that is substantially matched to an input impedance of one or more other delay blocks in the chain. The plurality of delay blocks is preferably configured such that a rise time and/or a fall time of each of the delay blocks are substantially the same. In this embodiment, fifteen delay blocks are included in the programmable delay circuit 200, although the invention is not limited to any particular number of delay blocks. Only the first delay block 204 and the last two delay blocks, 206 and 208, are shown for economy of explanation. The first delay block 204 has a delay d1 associated therewith, the fourteenth delay block 206 has a delay d14 associated therewith, and the fifteenth delay block 208 has a delay d15 associated therewith. Each of the delay blocks is preferably operative to generate a signal at an output thereof which is substantially identical to a signal supplied to an input of the delay block, but delayed in time by the delay value of the delay block.

Each of the delay blocks preferably comprises a pair of inverters connected together in series, although the invention is not limited to any specific number of inverters in a given delay block. Specifically, an input of a first inverter (e.g., inverter 203) forms an input of a given delay block (e.g., delay block 204), an output of the first inverter is connected to an input of a second inverter (e.g., inverter 205), and an output of the second inverter forms an output of the given delay block. Alternative arrangements of the delay blocks are similarly contemplated by the present invention, as will be apparent to those skilled in the art.

An output of each of the delay blocks is preferably coupled to a data input of a corresponding tri-state driver and to an input of a next successive delay block. Thus, a given delay tap (e.g., t1, . . . , t14, t15) in the programmable delay circuit 200 will have a delay that is substantially equal to a sum of the respective delays of all preceding delay blocks connected in the delay path between an input (a) of the programmable delay circuit and the output of the delay block corresponding to the given delay tap. The delay at tap t0 is assumed to be a minimum delay, d0, of the programmable delay circuit, and maybe referred to as a zero-delay tap. The delay at tap t1 will be substantially equal to d0+d1, and the delay at tap t15 will be substantially equal to d0+d1+d2+ . . . +d14+d15. The respective delays of the delay blocks are preferably substantially equal to one another so that the time delay between successive delay taps increases linearly along the chain of successive delay blocks, although the invention contemplates alternative delay configurations (e.g., logarithmic, binary, etc.), as will be understood by those skilled in the art.

The tri-state driver, as the name suggests, preferably comprises an output node that is operative in a first mode to generate logic 1 and logic 0 voltage levels, and is operative in a second mode to produce a third state characterized by a high-impedance (hi-Z) level (ideally, infinite impedance). In this second mode of operation, the output node of the tri-state driver can be considered a soft node that has been effectively isolated from input circuitry in the tri-state driver, such that the output node floats regardless of the voltage level applied to the input of the tri-state driver. The tri-state driver preferably includes a control input adapted to receive a tri-state enable signal, the mode of operation of the tri-state driver being a function of the tri-state enable signal.

An input signal, Clock_In, supplied to the input (a) of the programmable delay circuit 200 is fed to an input of a buffer 202, which in this case is an inverting buffer, although a non-inverting buffer may similarly be employed. Buffer 202 may, alternatively, be replaced with a delay block. An output of buffer 202 forms delay tap t0, which as previously stated may be considered a zero-delay tap. Buffer 202 in turn drives the chain of thirty inverters included in the delay blocks, represented herein as delay blocks 204, 206, 208. Specifically, the output of buffer 202 is connected to the input of first delay block 204, the output of first delay block 204 is connected to the input of a second delay block (not shown) at tap t1, the output of a thirteenth delay block (not shown) is connected to the input of the fourteenth delay block 206, and the output of the fourteenth delay block is connected to the input of the fifteenth delay block 208 at tap t14. An inverter 218 is preferably connected to the output of the fifteenth delay block 208, which is the last delay block in the chain, at tap t15 and is used as a dummy load for the delay block so that the last delay block sees essentially the same loading as all previous delay blocks in the chain, as previously explained.

The output of buffer 202 also drives the data input of corresponding tri-state driver 210 at tap t0. Each of the other delay taps, namely, t1 through t15, also drives an input of a corresponding tri-state driver in the programmable delay circuit 200. For example, tap t1 drives an input of tri-state driver 212, tap t4 drives an input of tri-state driver 214, and tap t5 drives an input of tri-state driver 216. Outputs from all sixteen tri-state drivers, of which only tri-state drivers 210, 212, 214 and 216 are shown for ease of explanation, are preferably connected together and form an input to an output driver 220, which in this illustrative embodiment is implemented by an inverter 222. The output driver 220, however, is not limited to the particular arrangement shown. Moreover, the output driver 220 need not be inverting, but may alternatively be non-inverting (e.g., non-inverting buffer). The output driver 220 is preferably operative to generate an output signal, Clock_Out, at an output (z) of the programmable delay circuit 200 which is a delayed version of the input signal Clock_In. Since the output signal generated by one or more of the tri-state drivers may be slightly unbalanced, which may be defined as the condition wherein a rise time of the output signal of a given driver does not equal a fall time of the output signal, a switching point of the delay block(s) corresponding to the one or more tri-state drivers can be adjusted as desired such that the rise and fall time of the output signal is substantially matched.

The programmable delay circuit 200 further comprises a decoder 224, or alternative decoding circuitry for selecting one of the plurality of delay paths in the programmable delay circuit. The decoder 224, which in this embodiment is implemented as a 4-to-16 line decoder, is operative to receive the four control signals Select[3:0] and to generate sixteen tri-state enable signals, ts_enb[0] through ts_enb[15], shown collectively as a 16-bit bus ts_enb[15:0]. Each of the tri-state enable signals preferably serves to activate a corresponding one of the tri-state drivers so that each unique 4-bit code selects only one tri-state driver and corresponding delay path at any given time.

The control signals Select[3:0] may be generated by a reference circuit 226 or other reference source, at least a portion of which may reside in the programmable delay circuit 200. It is similarly contemplated that the reference circuit 226, or at least a portion thereof, may reside externally with respect to the programmable delay circuit 200. The reference circuit 226 preferably includes an inverter 228 for supplying a substantially constant voltage, Tie_High, at a first output (t1) having a first logic level (e.g., logic "1"), and a non-inverting buffer 230 for supplying a substantially constant voltage, Tie_Low, at a second output (t0) having a second logic level (e.g., logic "0") which is a complement of the first logic level. Signals Tie_High and Tie_Low can be used to locally tie off the control inputs s0 through s3 for a static delay implementation which consumes minimal routing resources. Alternatively, the control inputs s0 through s3 can be connected to a register, or other memory (e.g., random access memory, etc.), which at least temporarily stores control signals Select[3:0] that are writable in a memory space of the design to allow for a dynamic delay implementation for changing the delay of the programmable delay circuit "on the fly" during normal operation.

Figure 3:
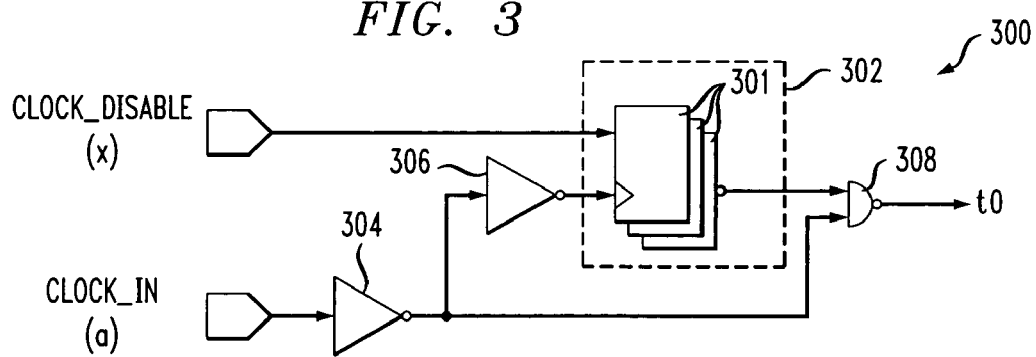
FIG. 3 is a schematic diagram depicting an input stage suitable for use in the programmable delay circuit shown in FIG. 2, in accordance with an aspect of the present invention.

FIG. 3 is a schematic diagram depicting an exemplary input circuit 300 suitable for use in the programmable delay circuit 200 shown in FIG. 2, in accordance with an aspect of the present invention. The input circuit 300, which may be used in place of buffer 202 in the programmable delay circuit 200 of FIG. 2, is preferably operative to force the output signal Clock_Out of the programmable delay circuit to a logic high or a logic low state when a control signal, Clock_Disable, supplied to a clock disable input (x) of the input circuit, is asserted. The clock disable (x) is supplied to a data input of a synchronizer 302, or alternative synchronization circuitry, which is clocked by the input signal Clock_In. The synchronizer 302 preferably comprises one or more latch stages 301 (e.g., D flip-flops). In the illustrative input circuit 300, three latch stages are employed, primarily to overcome metastability which may be present. Specifically, the input signal Clock_In is fed to a clock input of the synchronizer 302 through a first inverter 304, which may be the same as buffer 202 depicted in FIG. 2, and a second inverter 306 connected to an output of the first inverter. An output of the synchronizer 302 is connected to a first input of a logical NAND gate 308, or other logic circuitry. A second input of the NAND gate 308 is preferably connected to the output of the first inverter 304.

Logically "AND"ing or "OR"ing the output of the synchronizer 302 with the input of the chain of delay blocks beneficially enables the output signal Clock_Out generated by the programmable delay circuit 200 to be synchronously forced to either a logic high or a logic low value as a function of the state of the second input and irrespective of the values of control inputs Select[3:0]. The output of the NAND gate 308 is preferably substituted for the output of the buffer 202 in the programmable delay circuit 200 shown in FIG. 2. It is to be appreciated that NAND gate 308 can be similarly replaced by a NOR gate, with no or little modification of the input circuit 300. Changing the NAND gate to a NOR gate would force the output signal Clock_Out to a logic low state rather than a logic high state. If this type of functionality is required, for example in a scan-based application, a designer should insure that the input signal Clock_In can be passed to the output of the programmable delay circuit logically unmodified during scan mode. This can be accomplished, for example, by utilizing a synchronizer having an asynchronous set and/or reset input to force the output of the synchronizer to a known value during scan mode.

Figure 4:
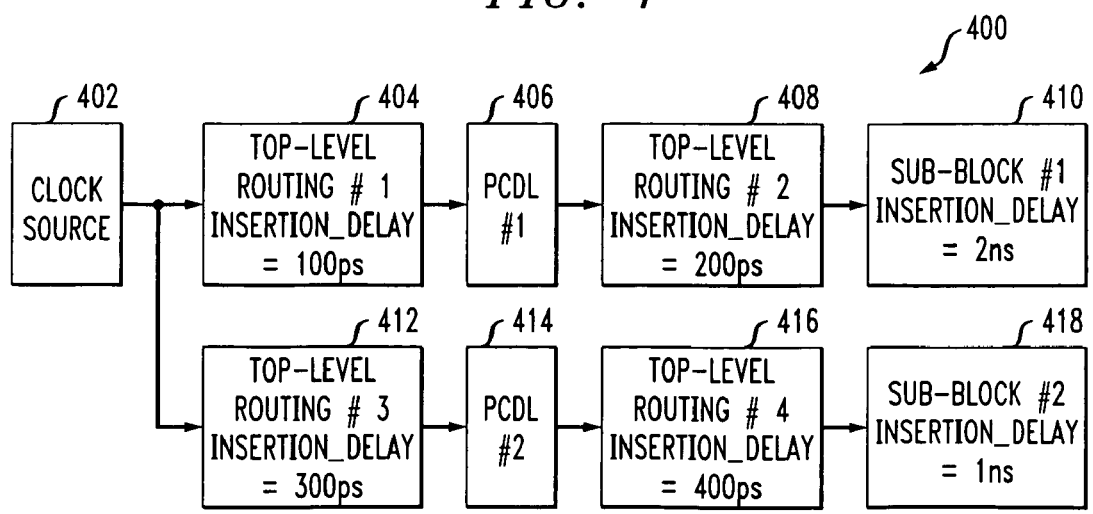
FIG. 4 is a block diagram illustrating at least a portion of a clock distribution network in which the techniques of the present invention may be employed for balancing clock insertion delays in the clock distribution network.

FIG. 4 is a block diagram illustrating at least a portion of an exemplary clock distribution network 400 in which the techniques of the present invention may be employed for balancing clock insertion delays in the clock distribution network. One or more programmable clock delay lines (PCDLs), which can be implemented in accordance with the techniques of the present invention (e.g., programmable delay circuit 200 shown in FIG. 2), are inserted into the clock distribution network 400 for each of the destination sub-blocks in the design, with the control inputs of each PCDL set to a value that provides minimum delay. For a given destination sub-block, the one or more PCDLs are preferably connected in series between a clock source 402 and the destination sub-block. Each sub-block may have an internal clock tree with different insertion delays for each branch of the clock tree. It is assumed, however, that clock insertion delay has already been balanced to the degree necessary within the sub-block. When the design is entered into a static timing tool, the insertion delays of each of the sub-block designs can be evaluated, as will be known by those skilled in the art.

Beginning with the clock source 402, the illustrative clock distribution network 400 includes a plurality of delay paths. A first delay path comprises top-level routing which may be modeled as block 404, a first PCDL 406, a second top-level routing which may be modeled as block 408, and a first sub-block 410, which may be a destination circuit or component of the clock source 402 in the first delay path. Likewise, a second delay path comprises a third top-level routing which can be modeled as block 412, a second PCDL 414, a fourth top-level routing which may be modeled as block 416, and a second sub-block 418 which may be a destination circuit or component of the clock source 402 in the second delay path.

By way of example only, and without loss of generality, assume that first top-level routing block 404 has an insertion delay of 100 picoseconds (ps), second top-level routing block 408 has an insertion delay of 200 ps, first sub-block 410 has an insertion delay of 2 nanoseconds (ns), second top-level routing block 412 has an insertion delay of 300 picoseconds (ps), fourth top-level routing block 416 has an insertion delay of 400 ps, and second sub-block 418 has an insertion delay of 1 ns. Also assume that both PCDLs 406, 414 are identical to one another and have a minimum delay of 150 ps (first tap selected) and a step delay of 50 ps per tap. In this example, with both PCDLs set to their minimum delay value (150 ps), the total clock insertion delay for the first sub-block 410 would be (100 ps+150 ps+200 ps+2 ns)=2450 ps, and the total clock insertion delay for the second sub-block 418 would be (300 ps+150 ps+400 ps+1 ns)=1850 ps. Thus, in this scenario the first and second delay paths are unbalanced, the first delay path having a total insertion delay which is 600 ps greater than the second delay path.

In order to balance insertion delays in the clock distribution network 400, 600 ps of delay should be added to the second delay path between the clock source and the second sub-block 418, making the total insertion delay for the second sub-block comparable to the total insertion delay for the first sub-block 410. This can be accomplished, in at least one aspect, by changing the delay value for the second PCDL 414 by selecting the thirteenth tap (50 ps×12 taps=600 ps) instead of the first tap (150 ps), so that the second PCDL 414 has an overall delay of 750 ps. This can be evaluated using, for example, case analysis in the static timing tool itself, without ever having to exit the static timing tool, modify the netlist, and/or re-enter the static timing tool with a new netlist. In this manner, the effects of changing delay taps for any number of PCDLs in much more complicated topologies can be quickly evaluated. Once the designer is satisfied with the delay values selected for the PCDLs in the clock distribution network, only one netlist modification iteration is required to set up the new delay values. If the delay values of the PCDLs are fully programmable through registers, or alternative storage elements, in the memory space of the device, then no netlist modification is even necessary.

It is to be understood that if more delay is required to be added in a given delay path than can be provided by a single PCDL, multiple PCDLs can be employed, connected in series between the clock source and the destination sub-block, in order to achieve the desired amount of delay. For example, in the illustrative clock distribution network 400, assume that the total insertion delay for the first sub-block 410 is 2400 ps and the total insertion delay for the second sub-block 418 is 1200 ps. In order to balance insertion delays in the network, 1200 ps of delay should be added to the second delay path. Since the second PCDL 414 is only able to provide 900 ps of delay at its maximum delay setting, a third PCDL (not shown) is preferably inserted in series with the second PCDL. In this scenario, tap 16 is selected in the second PCDL 414, thereby providing 900 ps of delay, and the fourth tap is selected in the third PCDL, thereby providing 300 ps of delay, to obtain a total delay of 1200 ps as required for balancing insertion delays in the network. The invention is not limited to any particular number of programmable delay circuits that may be included in a given delay path or clock distribution network.

If minimum clock insertion delay is a design objective and one of the destination sub-blocks is always guaranteed to have the longest insertion delay, it may be beneficial to give up some programmability and completely eliminate the PCDL from that sub-block's clock distribution path in the network, adjusting the delays of all other PCDLs accordingly. In the above example, assuming the first delay path is guaranteed to have a longer insertion delay, completely eliminating the first PCDL 406 will reduce the total insertion delay for the first sub-block 410 by 150 ps. The delay of the second PCDL 414 can then be reduced by selecting the tenth delay tap rather than the thirteenth tap. This saves 150 ps compared to the implementation described above, but gives up the ability to add any additional delay to the first sub-block's insertion delay.

Using the techniques of the present invention, the iteration time required for balancing clock insertion delay in a system (e.g., clock distribution network) can be significantly reduced, in at least one aspect, by allowing iterations to be performed directly in the static timing tool without having to make numerous netlist changes, as is conventionally required. Moreover, by employing selection registers in the memory space of the design, the delay of the programmable delay circuit can be changed after the design is implemented in silicon. This allows a designer to make adjustments to the delay as may be necessary due, for example, to PVT variations, timing analysis errors, etc. The programmable delay circuit of the present invention utilizes tri-state drivers in order to minimize insertion delay.

At least a portion of the methodologies of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A programmable delay circuit, comprising:
   a plurality of delay blocks connected together so as to form a series chain, an input of a first one of the plurality of delay blocks forming an input of the programmable delay circuit and being adapted to receive a first signal supplied to the programmable delay circuit;
   a plurality of tri-state drivers, each of the tri-state drivers including an input connected to an output of a corresponding one of the delay blocks, and a control input adapted to receive one of a plurality of control signals, the tri-state driver being operative in one of at least a first mode and a second mode as a function of a corresponding one of the control signals, wherein in the first mode an output signal generated at an output of the tri-state driver is a function of a voltage level at the input of the tri-state driver, and in the second mode the output of the tri-state driver is in a high-impedance state, the output of each of the tri-state drivers being coupled together and forming an output of the programmable delay circuit;
   at least one decoder connected to the plurality of tri-state drivers, the decoder including at least one control input for receiving at least a second signal and being operative to generate the plurality of control signals for selectively activating a corresponding one of the tri-state drivers as a function of the second signal; and
   an input circuit including:
      synchronization circuitry, the synchronization circuitry having a first input adapted to receive a third signal and a second input adapted to receive at least a portion of the first signal; and
      logic circuitry having a first input connected to an output of the synchronization circuitry, a second input adapted to receive the first signal, and an output connected to the input of a first one of the plurality of tri-state drivers;
   wherein the input circuit is operative to synchronously force the output of the programmable delay circuit to one of a logic high level and a logic low level as a function of the third signal;
   wherein a delay between the input and the output of the programmable delay circuit is controlled as a function of the second signal.

2. The circuit of claim 1, wherein the plurality of delay blocks comprises a first delay block, a last delay block and one or more intermediate delay blocks, an output of the first delay block being connected to an input of a first one of the intermediate delay blocks, and an output of each of the intermediate delay blocks being connected to an input of a next successive delay block in the chain.

3. The circuit of claim 2, wherein an output of the last delay block is connected to a dummy load configured to have an impedance that is substantially matched to an input impedance of each of one or more other delay blocks in the chain.

4. The circuit of claim 1, wherein at least one of the plurality of delay blocks comprises a pair of inverters, an input of a first of the inverters forming the input of the delay block, an output of the first inverter being connected to an input of a second of the inverters, and an output of the second inverter forming the output of the delay block.

5. The circuit of claim 1, wherein the first one of the delay blocks comprises a buffer.

6. The circuit of claim 1, wherein respective delays of the delay blocks are substantially the same.

7. The circuit of claim 1, wherein respective delays of the delay blocks are different.

8. The circuit of claim 1, further comprising an output driver having an input connected to the outputs of the respective tri-state drivers and having an output forming the output of the programmable delay circuit.

9. The circuit of claim 1, further comprising a reference circuit operative to generate the at least second signal supplied to the at least one decoder.

10. The circuit of claim 1, wherein the at least second signal for selectively activating one of the plurality of tri-state drivers is stored in memory, the delay of the programmable delay circuit being dynamically controlled during normal operation of the circuit.

11. The circuit of claim 1, wherein the first signal comprises a high-frequency repetitive timing signal.

12. The circuit of claim 1, wherein the synchronization circuitry comprises at least one latch.

13. The circuit of claim 1, wherein the logic circuitry comprises at least one of a functional AND gate and a functional OR gate.

14. The circuit of claim 1, wherein a switching point of at least a given one of the plurality of delay blocks is configured such that a rise time and a fall time of the output signal generated at the output of a corresponding tri-state driver connected to the given delay block are substantially the same.

15. The circuit of claim 1, wherein at least a subset of the plurality of delay blocks is configured such that at least one of a rise time and a fall time of the respective delay blocks is substantially the same.

16. An integrated circuit including at least one programmable delay circuit, the at least one programmable delay circuit comprising:

a plurality of delay blocks connected together so as to form a series chain, an input of a first one of the plurality of delay blocks forming an input of the at least one programmable delay circuit and being adapted to receive a first signal supplied to the at least one programmable delay circuit;

a plurality of tri-state drivers, each of the tri-state drivers including an input connected to an output of a corresponding one of the delay blocks, and a control input adapted to receive one of a plurality of control signals, the tri-state driver being operative in one of at least a first mode and a second mode as a function of a corresponding one of the control signals, wherein in the first mode an output signal generated at an output of the tri-state driver is a function of a voltage level at the input of the tri-state driver, and in the second mode the output of the tri-state driver is in a high-impedance state, the output of each of the tri-state drivers being coupled together and forming an output of the at least one programmable delay circuit;

at least one decoder connected to the plurality of tri-state drivers, the decoder including at least one control input for receiving at least a second signal and being operative to generate the plurality of control signals for selectively activating a corresponding one of the tri-state drivers as a function of the second signal; and an input circuit including:

synchronization circuitry, the synchronization circuitry having a first input adapted to receive a third signal and a second input adapted to receive at least a portion of the first signal; and logic circuitry having a first input connected to an output of the synchronization circuitry, a second input adapted to receive the first signal, and an output connected to the input of a first one of the plurality of tri-state drivers;

wherein the input circuit is operative to synchronously force the output of the programmable delay circuit to one of a logic high level and a logic low level as a function of the third signal;

wherein a delay between the input and the output of the at least one programmable delay circuit is controlled as a function of the second signal.

17. The integrated circuit of claim 16, wherein the plurality of delay blocks comprises a first delay block, a last delay block and one or more intermediate delay blocks, an output of the first delay block being connected to an input of a first one of the intermediate delay blocks, and an output of each of the intermediate delay blocks being connected to an input of a next successive delay block in the chain.

18. The integrated circuit of claim 17, wherein an output of the last delay block is connected to a dummy load configured to have an impedance that is substantially matched to an input impedance of each of one or more other delay blocks in the chain.

* * * * *